United States Patent
Kim

(10) Patent No.: US 7,315,687 B2
(45) Date of Patent: Jan. 1, 2008

(54) METHOD FOR SETTING AN RF CHANNEL IN A VIDEO CASSETTE RECORDER

(75) Inventor: Young Nam Kim, Seoul (KR)

(73) Assignee: Daewoo Electronics Corporation, Seoul (KR)

( * ) Notice: Subject to any disclaimer, the term of this patent is extended or adjusted under 35 U.S.C. 154(b) by 808 days.

(21) Appl. No.: 10/810,798

(22) Filed: Mar. 29, 2004

(65) Prior Publication Data
US 2004/0190859 A1 Sep. 30, 2004

(30) Foreign Application Priority Data
Mar. 31, 2003 (KR) ............ 10-2003-0019987

(51) Int. Cl.
H04N 7/00 (2006.01)
H04N 5/91 (2006.01)
H04N 7/173 (2006.01)

(52) U.S. Cl. .................. 386/46; 386/83; 725/133

(58) Field of Classification Search .......... 386/46, 386/83, 1, 84; 725/131, 133
See application file for complete search history.

(56) References Cited

U.S. PATENT DOCUMENTS 5,734,786 A * 3/1998 Mankovitz ............. 386/96
6,233,734 B1 * 5/2001 Macrae et al. ........... 725/50
2004/0133921 A1 * 7/2004 Kakiuchi et al. ........ 725/131
2005/0081245 A1 * 4/2005 Arad et al. ............. 725/100

FOREIGN PATENT DOCUMENTS

| EP | 0 577 283 | 1/1994 |
|---|---|---|
| EP | 1 062 803 | 2/2003 |
| JP | 6-20335 | 1/1994 |
| JP | 7-87411 | 3/1995 |

* cited by examiner

Primary Examiner—Robert Chevalier
(74) Attorney, Agent, or Firm—Bacon & Thomas, PLLC

(57) ABSTRACT

In a method for setting an RF channel in a VCR (video cassette recorder) system connected to a TV, it is checked whether a signal for setting a target RF channel in the VCR system is generated, e.g., by pressing a button installed on a remote control unit for the VCR system. Then, if the signal for setting the target RF channel is generated, the target RF channel is searched and a VCR message signal to be displayed on a screen of the TV is loaded on a carrier wave frequency corresponding to a current RF channel. Subsequently, a user confirms that the current RF channel is set as the target RF channel by pressing the button. In this way, the user can easily set an RF channel in a VCR system without setting a TV channel.

4 Claims, 1 Drawing Sheet

METHOD FOR SETTING AN RF CHANNEL IN A VIDEO CASSETTE RECORDER

FIELD OF THE INVENTION

The present invention relates to a method for setting an RF channel in a VCR (video cassette recorder); and, more particularly, to a method for automatically setting an RF channel in a VCR system without separately setting a TV channel corresponding to the RF channel.

BACKGROUND OF THE INVENTION

FIG. 1 illustrates a block diagram of an exemplary VCR (video cassette recorder) system. As shown in FIG. 1, the VCR system includes a tuner 102 for selecting a particular RF signal among RF signals received through an antenna 110 and converting the selected RF signal into an IF (intermediate frequency) signal, which is outputted to a controller 104, the controller 104 for controlling an operation of the VCR system, an OSD (on screen display) processor 106 for generating various information such as channel information to be displayed on a screen of a TV set and an RF modulator 108 for converting the IF signal provided from the controller 104 into an RF signal.

In such a VCR system, the RF modulator 108 loads the RF signal onto a carrier wave frequency corresponding to an RF channel predetermined by the controller 104. In this case, the RF channel may be selected from a plurality of channels available in an area where the VCR system is used. For example, in a VCR system used in Europe, an RF channel may be selected among channels ranging from 22 to 69.

However, in the VCR system, after its user selects one channel among the available RF channels, e.g., by using a key input device 101, they must set a TV channel corresponding to the selected RF channel in order to view an audio/video signal outputted from the VCR system via a TV. For instance, in case of a VCR system used in Europe, the RF channel in the VCR system is predetermined among the channels ranging from 22 to 69, and then a user of the VCR system separately alter a TV channel in order to view the audio/video signal from the VCR system.

Recently, a DCS (direct channel setting) method has been used for ameliorating the above-mentioned inconvenience in setting the RF channel in the VCR system. In the DCS method, a user may press one of numeric keys on the key input device 101 to set the RF channel of the VCR system when a prompt message is displayed on a screen of a TV set connected to the VCR system. However, even when using the DCS method, the user still must separately set a TV channel corresponding to the RF channel in order to view the audio/video signal from the VCR system.

SUMMARY OF THE INVENTION

It is, therefore, an object of the present invention to provide a method for automatically setting an RF channel in a VCR system without setting a TV channel by pressing a button for setting the RF channel on the VCR system or a remote control unit for the VCR system.

In accordance with the present invention, there is provided a method for setting an RF channel in a VCR (video cassette recorder) system connected to a TV, comprising the steps of: (a) checking whether a signal for setting a target RF channel in the VCR system is generated; (b) if the signal for setting the target RF channel is not generated, returning to step (a); (c) searching for the target RF channel by selecting a current RF channel from RF channels available for the VCR system; (d) loading a VCR message signal to be displayed on a screen of the TV on a carrier wave frequency corresponding to the current RF channel; (e) requesting a user to confirm that the current RF channel is set as the target RF channel; (f) if the user has not confirmed that the current RF channel is set as the target RF channel, returning to step (c); and (g) setting the current RF channel as the target RF channel.

BRIEF DESCRIPTION OF THE DRAWING

The above and other objects and features of the present invention will become apparent from the following description of preferred embodiments given in conjunction with the accompanying drawings, in which.

DETAILED DESCRIPTION OF THE PREFERRED EMBODIMENTS

Figure 1:
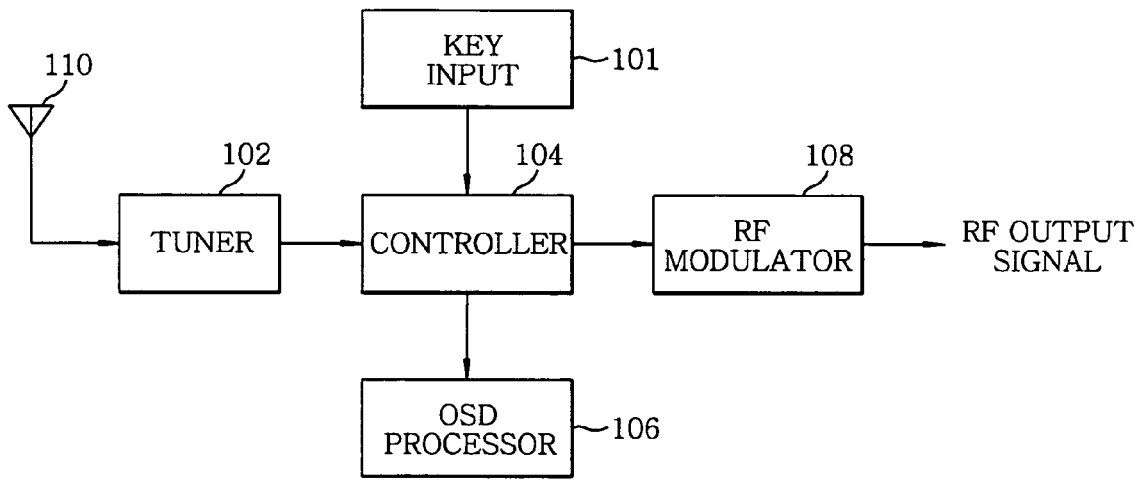
FIG. 1 depicts a block diagram of an exemplary VCR system.

A configuration of a VCR (video cassette recorder) system in accordance with a preferred embodiment of the present invention is similar to the VCR system shown in FIG. 1. Therefore, in the following, the VCR system in accordance with the preferred embodiment of the present invention will be described with reference to FIG. 1, wherein like reference numerals refer to like elements throughout.

As described above with reference to FIG. 1, a tuner 102 selects a particular RF signal among RF signals received through an antenna 110 and converting the selected RF signal into an IF signal, which is transmitted to a controller 104. Subsequently, an RF modulator 108 converts the IF signal provided from the controller 104 into an RF signal, which is loaded onto a carrier wave frequency corresponding to an RF channel that is determined automatically by the controller 104. The procedure for automatically setting the RF channel will be described in detail later.

On a key input device 101, an automatic RF channel setting key, e.g., an "EASY" key may be installed. If a user presses the "EASY" key, the procedure for automatically setting the RF channel is initiated. In the preferred embodiment of the present invention, the key input device 101 on which the "EASY" key is installed may be arranged on a body of the VCR system or implemented by employing a remote control unit for the VCR system.

Figure 2:
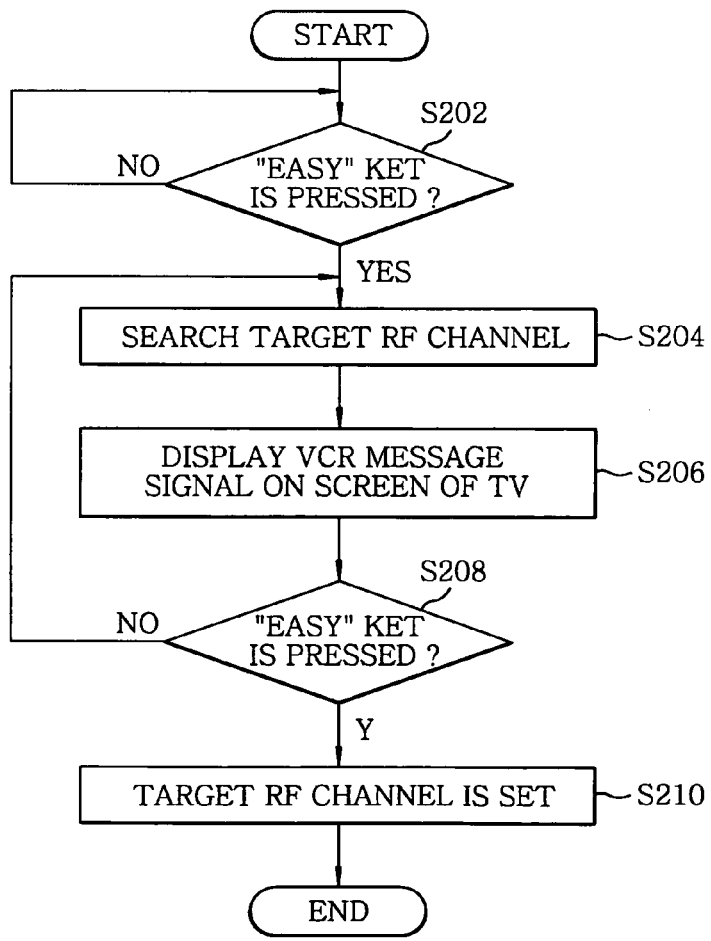
FIG. 2 charts a flowchart showing a method for setting an RF channel in a VCR system in accordance with a preferred embodiment of the present invention.

In the ensuing discussion, the procedure for automatically setting the RF channel in accordance with the preferred embodiment of the present invention is presented in detail with reference to FIG. 2.

First, the controller 104 checks whether the "EASY" key has been pressed or not (step 202). In step S202, when it is found that the "EASY" key has been pressed, the controller 104 starts to carry out an automatic searching for a target RF channel for the VCR system (step S204). Herein, the automatic searching for the target RF channel may be performed by selecting a current RF channel among RF channels available for the VCR system, e.g., by variably generating a carrier wave frequency corresponding to the current RF channel while shifting from a low channel frequency to a high channel frequency by a predetermined frequency bandwidth.

Subsequently, once the current RF channel is selected, the controller 104 controls the RF modulator 108 to load a VCR message signal, e.g., "no signal" message signal or "VCR" icon signal to be displayed on a screen of a TV, on the carrier wave frequency corresponding to the current RF channel. Therefore, if the currently selected RF channel is tuned to a current TV channel, the VCR message signal loaded on the carrier wave frequency will be displayed on the screen of the TV connected to the VCR system (step S206).

Further, in addition to the VCR message signal, there is displayed on the screen of the TV a message for requesting the user to confirm that the currently selected RF channel is set as the target RF channel, e.g., by pressing the "EASY" key (step S208). If the user confirms, e.g., by pressing the "EASY" key, that the currently selected RF channel is set as the target RF channel, the procedure for automatically setting the RF channel is completed (step S210). Otherwise, the searching for the target RF channel is resumed by returning to step S204.

While the invention has been shown and described with respect to the preferred embodiments, it will be understood by those skilled in the art that various changes and modifications may be made without departing from the spirit and scope of the invention as defined in the following claims.

What is claimed is:

1. A method for setting an RF channel in a VCR (video cassette recorder) system connected to a TV, comprising the steps of:
   (a) checking whether a signal for setting a target RF channel in the VCR system is generated;
   (b) if the signal for setting the target RF channel is not generated, returning to step (a);
   (c) searching for the target RF channel by selecting a current RF channel from RF channels available for the VCR system;
   (d) loading a VCR message signal to be displayed on a screen of the TV on a carrier wave frequency corresponding to the current RF channel;
   (e) requesting a user to confirm that the current RF channel is set as the target RF channel;
   (f) if the user has not confirmed that the current RF channel is set as the target RF channel, returning to step (c); and
   (g) setting the current RF channel as the target RF channel.

2. The method of claim 1, wherein step (c) is performed by shifting a carrier wave frequency corresponding to the current RF channel by a predetermined frequency bandwidth.

3. The method of claim 1, wherein, in step (a), the signal for setting the target RF channel is generated by pressing a button installed on the VCR system or on a remote control unit for the VCR system.

4. The method of claim 3, wherein, in step (e), the user confirms that the current RF channel is set as the target RF channel by pressing the button.

* * * * *